US005932392A

United States Patent [19]

Hirai et al.

[11] Patent Number: 5,932,392

[45] Date of Patent: Aug. 3, 1999

[54] IMAGE FORMING MATERIAL AND IMAGE FORMING METHOD

[75] Inventors: Katsura Hirai; Noriyuki Kizu, both of Hino, Japan

[73] Assignee: Konica Corporation, Tokyo, Japan

[21] Appl. No.: 08/944,422

[22] Filed: Oct. 6, 1997

[30] Foreign Application Priority Data

Oct. 7, 1996 [JP] Japan .................................... 8-265797
Nov. 27, 1996 [JP] Japan .................................... 8-316192

[51] Int. Cl.[6] ...................................................... G03F 7/004

[52] U.S. Cl. ........................ 430/270.1; 430/905; 430/920

[58] Field of Search ................................ 430/270.1, 905, 430/920

[56] References Cited

U.S. PATENT DOCUMENTS

| | | | |
|---|---|---|---|
| 2,243,621 | 5/1941 | Denoix . | |
| 2,610,842 | 9/1952 | Schoenmakers et al. . | |
| 3,515,552 | 6/1970 | Smith . | |
| 3,536,489 | 10/1970 | Smith . | |
| 3,779,779 | 12/1973 | Landsman . | |
| 3,779,998 | 12/1973 | Hermann . | |
| 5,340,699 | 8/1994 | Haley . | |
| 5,372,915 | 12/1994 | Haley et al. | 430/302 |
| 5,658,708 | 8/1997 | Kondo | 430/288.1 |
| 5,731,127 | 3/1998 | Ishizuka et al. | 430/270.1 |

*Primary Examiner*—John S. Chu
*Assistant Examiner*—Yvette M. Clarke
*Attorney, Agent, or Firm*—Finnegan, Henderson, Farabow, Garrett & Dunner, L.L.P.

[57] ABSTRACT

Disclosed are an image forming material comprising a support and provided thereon, a light sensitive layer containing a compound capable of generating an acid on exposure of infrared rays, a resol resin, an acryl resin containing a monomer unit with a phenolic hydroxy group, and an infrared absorber and an image forming method employing the image forming material.

12 Claims, No Drawings

IMAGE FORMING MATERIAL AND IMAGE FORMING METHOD

FIELD OF THE INVENTION

The present invention relates to an image forming material comprising a light sensitive layer containing a compound generating an acid by an active light radiation, a compound chemically changed in the presence of the acid, and an infrared absorber, the light sensitive layer being infrared light sensitive, and capable of forming a positive or negative image, and an image forming method employing the same.

BACKGROUND OF THE INVENTION

As a positive working light sensitive layer to be solubilized by an active light radiation a light sensitive layer containing a photolytic acid generating compound and an acid decomposable compound is known. A light sensitive composition containing a water insoluble compound having a specific group capable of decomposed by an acid is disclosed in U.S. Pat. No. 3,779,779, a light sensitive composition containing a compound having an acetal or a ketal in the main chain is disclosed in Japanese Patent O.P.I. Publication No. 53-133429/1978, and a light sensitive composition containing a compound having a silylether group is disclosed in Japanese Patent O.P.I. Publication No. 65-37549/1985. These compounds have sensitivity in the ultraviolet range and are those capable of being solubilized by ultraviolet radiation, and can not give an image by irradiation of an infrared light such as a cheap and compact semiconductor laser.

As a technique for forming an image by exposure of infrared light such as a semiconductor laser, an image forming material comprising a light sensitive layer containing an acid generating compound, a resol resin, a novolak resin and an infrared absorber is disclosed in U.S. Pat. No. 5,340,699. The image forming material is imagewise exposed, heat-treated (pre-baked) before development, and then developed to form a negative image, or is imagewise exposed and then developed without the pre-baking to form a positive image. However, a planographic printing plate prepared by applying this technique is low in printing durability and therefore, additional baking (post-baking) after development is necessary, which is inconvenient to users. Further, the heat treatment after exposure and before development takes more processing time and lengthens the processing time. Further, the heat treatment requires high temperature, resulting in much electrical power consumption or more load to the processor.

SUMMARY OF THE INVENTION

A first object of the invention is to provide an image forming material and image forming method which are capable of forming a positive image by infrared ray exposure.

A second object of the invention is to provide an image forming material and image forming method which provide high printing durability and do not require post-baking treatment after development.

A third object of the invention is to provide an image forming material and image forming method which are capable of allowing heat treatment conditions after exposure and before development to be less intense and shortening the processing time.

DETAILED DESCRIPTION OF THE INVENTION

The above object of the invention can be attained by the followings:

An image forming material comprising a support and provided thereon, a light sensitive layer containing a compound capable of generating an acid on exposure of an active light, a resol resin, an acryl resin having containing a monomer unit with a phenolic hydroxy group, and an infrared absorber, or an image forming method comprising the steps of imagewise exposing the above material to infrared rays, heat-treating the exposed material and removing the light sensitive layer at unexposed portions of the heated material by developing with an alkaline developer.

The present invention will be detailed below.

The compound (hereinafter referred to as the photolytic acid generating compound of the invention) capable of generating an acid on exposure of an active light used in the light sensitive layer of the image forming material of the invention includes various conventional compounds and their mixtures. For example, a salt of diazonium, phosphonium, sulfonium or iodonium ion with $BF_4^-$, $PF_6^-$, $SbF_6^-$ $SiF_6^{2-}$ or $ClO_4^-$, an organic halogen containing compound, o-quinonediazide sulfonylchloride or a mixture of an organic metal and an organic halogen containing compound is a compound or composition capable of generating or releasing an acid on irradiation of an active light and can be used as the photolytic acid generating compound of the invention. The organic halogen containing compound known as an photoinitiator capable of forming a free radical produces a hydrogen halide and can be used as the photolytic acid generating compound of the invention.

The examples of the organic halogen containing compound capable of producing a hydrogen halide include those disclosed in U.S. Pat. Nos. 3,515,552, 3,536,489 and 3,779,778 and West German Patent No. 2,243,621, and compounds generating an acid by photodegradation disclosed in West German Patent No. 2,610,842.

Further, a 2-halomethyl-1,3,4-oxadiazole compound, for example, 2-trichloromethyl-5-[β(2-benzofuryl)vinyl]-1,3,4-oxadiazole can be used which is disclosed in Japanese Patent O.P.I. Publication Nos. 54-74728, 55-24113, 55-77742, 60-3626, and 60-138539. The examples of the photolytic acid generating compounds used in the invention include o-naphthoquinone diazide-4-sulfonylhalogenides disclosed in Japanese Patent O.P.I. Publication No. 56-17345/1981, pp 13, left upper column to right upper column, or Japanese Patent O.P.I. Publication No. 50-30209.

The preferable photolytic acid generating compound in the invention is an organic halogen containing compound in view of sensitivity to infrared rays and storage stability of an image forming material using it. The organic halogen containing compound is preferably halogenated alkyl containing triazines or halogenated alkyl containing oxadiazoles. Of these, halogenated alkyl containing s-triazines are especially preferable.

The examples of the halogenated alkyl containing oxadiazoles include a 2-halomethyl-1,3,4-oxadiazole compound disclosed in Japanese Patent O.P.I. Publication Nos. 54-74728, 55-24113, 55-77742/1980, 60-3626 and 60-138539. The preferable examples of the 2-halomethyl-1,3,4-oxadiazole compound are listed below.

A

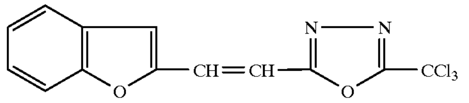

B

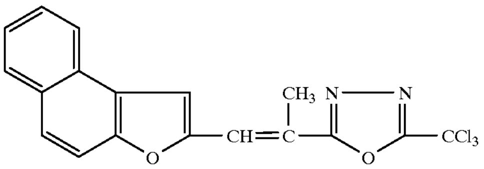

C

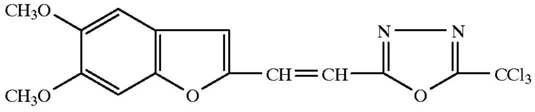

The halogenated alkyl containing triazines are preferably a compound represented by the following formula (1):

formula (1)

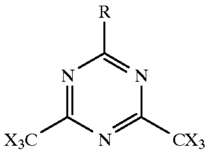

wherein R represents a styryl group or an aryl group, each of which may have an alkyl group, a halogenated alkyl, or an alkoxy group; and X represents a halogen atom. The aryl group includes phenyl or naphthyl.

The examples of s-triazines represented by formula (1) are listed below.

(1)

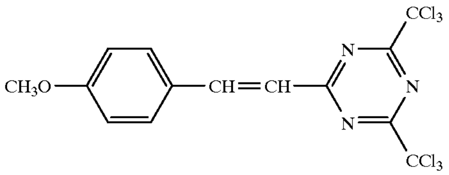

(2)

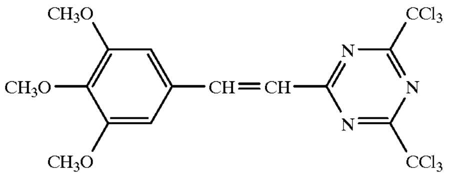

(3)

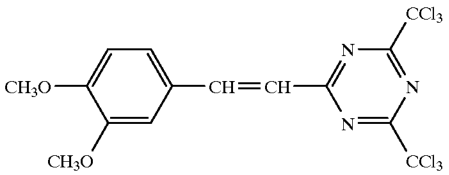

-continued (4)

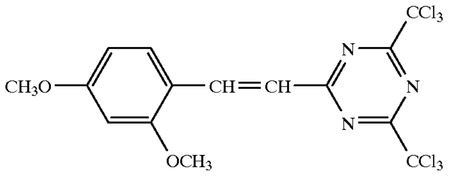

(5)

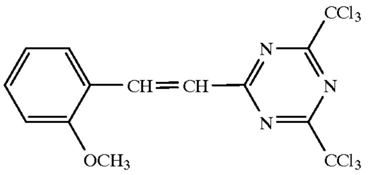

(6)

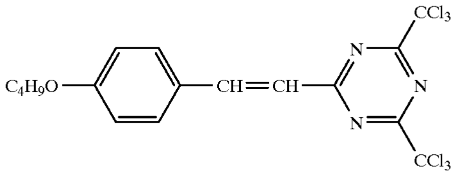

(7)

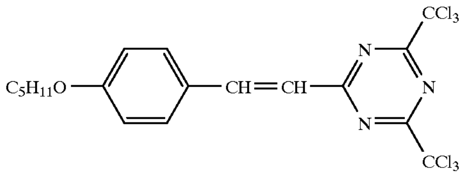

(8)

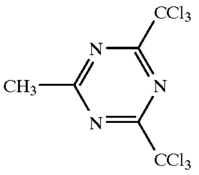

(9)

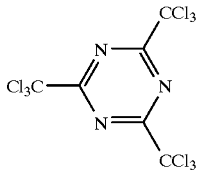

(10)

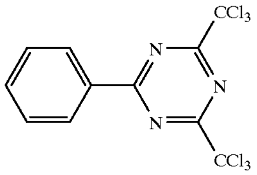

(11)

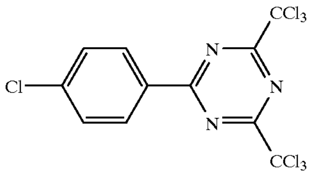

-continued (12)

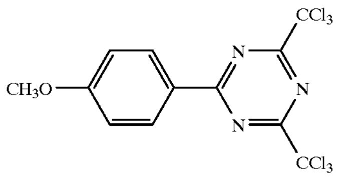

(13)

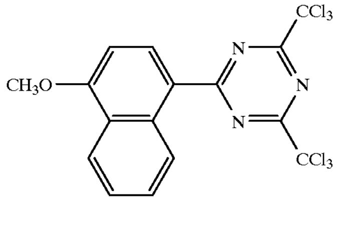

(14)

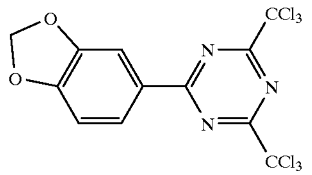

The content of the photolytic acid generating compound is preferably about 0.1 to 20% by weight, and more preferably 0.2 to 10% by weight based on the total weight of light sensitive layer, although the content broadly varies depending on its chemical properties or a composition or physical property of the light sensitive layer.

The resol resin in the invention is an alkali insoluble phenol resin obtained by reacting phenol with formaldehyde in the presence of an alkaline catalyst to produce a resin containing a methylol group, and then heating the resulting resin to cause cross-linking reaction.

In the invention, the content of the resol resin is preferably about 5 to 80% by weight, and more preferably 20 to 50% by weight based on the total weight of light sensitive layer.

The monomer having a phenolic hydroxy group used in the acryl resin in the invention includes an exemplified compound listed below.

A monomer having a phenolic hydroxy group, for example, N-4-hydroxyphenylacrylamide, N-4-hydroxyphenyl-methacrylamide, o-hydroxystyrene, p-hydroxystyrene, m-hydroxystyrene, o-hydroxyphenylacrylate, p-hydroxyphenyl-acrylate, m-hydroxyphenylacrylate, p-(hydroxyphenyl)sulfonylacrylamide, and p-(hydroxyphenyl)sulfonylmethacrylamide.

The content in the acryl resin of the monomer having a phenolic hydroxy group is preferably 1 to 50 mol %.

The acryl resin in the invention is preferably a copolymer of the monomer exemplified above and a monomer as shown in Group (1) or (2) below.

(1) A monomer having an aliphatic hydroxy group, for example, 2-hydroxyethylacrylate, 2-hydroxyethylmethacrylate, N-methylolacrylamide, N-methylolmethacrylamide, N,N-dimethylolacrylamide, N,N-dimethylolmethacrylamide, 4-hydroxybutylacrylate, 4-hydroxybutylmethacrylate, 5-hydroxypentylacrylate, 5-hydroxypentylmethacrylate, 6-hydroxyhexylacrylate, 6-hydroxyhexylmethacrylate, N-(2-hydroxyethyl)acrylamide, N-(2-hydroxyethyl)methacrylamide, N,N-di(2-hydroxyethyl)acrylamide, N,N-di(2-hydroxyethyl)-methacrylamide, N-hydroxymethyl-N-(2-hydroxyethyl)acrylamide, N-hydroxymethyl-N-(2-hydroxyethyl)methacrylamide, hydroxyethylvinyl ether, vinylbenzyl alcohol, α-methyl-vinylbenzyl alcohol, vinylphenetyl alcohol, or (α-methyl-vinylphenetyl alcohol.

(2) A vinylaralkyl acetate, for example, (o, m or p-) vinylbenzyl acetate, (o, m or p-)α-methylvinylbenzyl acetate, (o, m or p-)vinylphenetyl acetate, or (o, m or p-)α-methylvinylphenetyl acetate.

The acryl resin in the invention is especially preferably a copolymer of the monomer having a phenolic hydroxy group described above, the monomer exemplified in (1) or (2) above and a monomer selected from monomers as shown in Groups (3) through (15) below, in view of developability or sensitivity.

(3) A monomer having a sulfonamido group, for example, m-aminosulfonylphenyl methacrylate, p-aminosulfonylphenyl methacrylate, m-aminosulfonylphenyl acrylate, p-amninosulfonylphenyl acrylate, N-(p-aminosulfonylphenyl)methacrylamide, N-(p-aminosulfonylphenyl)acrylamide, N-(p-toluenesulfonyl)acrylamide, and N-(p-toluenesulfonyl) methacrylamide.

(4) An α,β-unsaturated carboxylic acid, for example, acrylic acid, methacrylic acid, maleic acid, maleic anhydride, itaconic acid, itaconic anhydride, (5) A substituted or unsubstituted alkylacylate, for example, methylacrylate, ethylacrylate, propylacrylate, butylacrylate, amylacrylate, hexylacrylate, heptylacrylate, octylacrylate, nonylacrylate, decylacrylate, undecylacrylate, dodecylacrylate, benzylacrylate, cyclohexylacrylate, 2-chloroethylacrylate, N,N-dimethylaminoethylacrylate, glycidylacrylate, (6) A substituted or unsubstituted alkylmethacylate, for example, methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, benzylmethacrylate, cyclohexylmethacrylate, 2-chloroethylmethacrylate, N,N-dimethylaminoethylmethacrylate, glycidylmethacrylate, methacrylamide, (7) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, (8) A monomer having a fluorinated alkyl group, for example, trifluoroethylacrylate, trifluoroethylmethacrylate, tetrafluoropropylacrylate, tetrafluoropropylmethacrylate, hexafluoropropylmethacrylate, octafluoropentylacrylate, octafluoropentylmethacrylate, heptadecafluorodecylacrylate, heptadecafluorodecylmethacrylate, N-butyl-N-(2-acryloxyethyl)heptadecafluorooctylsulfonamide, (9) A vinyl ether, for example, ethylvinyl ether, 2-chloroethylvinyl ether, propylvinyl ether, butylvinyl ether, octylvinyl ether, phenylvinyl ether,

(10) A vinyl ester, for example, vinyl acetate, vinyl chroloacetate, vinyl butate, vinyl benzoate,

(11) A styrene, for example, styrene, methylstyrene, chloromethystyrene,

(12) A vinyl ketone, for example, methylvinyl ketone, ethylvinyl ketone, propylvinyl ketone, phenylvinyl ketone,

(13) An olefin, for example, ethylene, propylene, isobutylene, butadiene, isoprene,

(14) N-vinylpyrrolidone, N-vinylcarbazole, N-vinylpyridine,

(15) A monomer having a cyano group, for example, acrylonitrile, methacrylonitrile, 2-pentenenitrile, 2-methyl-3-butene nitrile, 2-cyanoethylacrylate, o-cyanostyrene, m-cyanostyrene, p-cyanostyrene.

Another monomer, which is capable of being copolymerized with the following monomers, may be added to the mixture of the monomers above described. The copolymer obtained by copolymerization of the above described monomers may be modified with glycidylacrylate or glycidylmethacrylate.

Of the copolymers, the preferable copolymer is a copolymer obtained by copolymerization of 1 to 50 mol % of a monomer selected from the monomers having a phenolic hydroxy group 1 to 30 mol % of a monomer selected from the monomers of Group (1) or (2), 0 to 20 mol % of an α,β-unsaturated carboxylic acid monomer selected from the monomers of Group (4), 5 to 40 mol % of a cyano-containing monomer selected from the monomers of Group (15), and 25 to 60 mol % of an acrylate or methacrylate monomer selected from the monomers of Group (5) or (6). The more preferable copolymer is a copolymer obtained by the copolymerization of 1 to 50 mol %, preferably 5 to 30 mol % of at least one selected from the following monomers:

N-methylolacrylamide, N-methylolmethacrylamide, N,N-dimethylolacrylamide, N,N-dimethylolmethacrylamide, 4-hydroxybutylacrylate, N-(2-hydroxyethyl) acrylamide, N-(2-hydroxyethyl)methacrylamide, N,N-di(2-hydroxyethyl)acrylamide, N,N-di(2-hydroxyethyl) methacrylamide, N-hydroxymethyl-N-(2-hydroxyethyl) acrylamide, N-hydroxymethyl-N-(2-hydroxyethyl) methacrylamide, hydroxyethylvinyl ether, vinylbenzyl alcohol, α-methylvinylbenzyl alcohol, (o, m, or p-)vinylbenzyl acetate, (o, m, or p-)α-methylvinylbenzyl acetate, vinylphenetyl alcohol, α-methylvinylphenetyl alcohol, (o, m, or p-)vinylphenetyl acetate, or (o, m, or p-)α-methylvinylphenetyl acetate.

In the invention, the monomer having a phenolic hydroxy group is preferably a monomer represented by the following formula (2), and its preferable examples are N-4-hydroxyphenylacrylamide, N-4-hydroxyphenylmethacrylamide, p-(hydroxyphenyl)sulfonylacrylamide, or p-(hydroxyphenyl)-sulfonylmethacrylamide as described above.

formula (2)

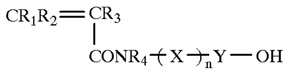

wherein $R_1$ and $R_2$ independently represent a hydrogen atom, an alkyl group such as methyl or ethyl, or a carboxyl group, and preferably a hydrogen atom; $R_3$ represents a hydrogen atom, a halogen atom such as chlorine or bromine, or an alkyl group such as methyl or ethyl, and preferably a hydrogen atom or methyl; $R_4$ represents a hydrogen atom, an alkyl group such as methyl, or an aryl group such as a phenyl group or a naphthyl group; Y represents a substituted or unsubstituted phenylene or naphthylene group, the substituent including an alkyl group such as methyl or ethyl, a halogen atom such as chlorine or bromine, a carboxyl group, an alkoxy group such as methoxy or ethoxy, a hydroxy group, a sulfonic acid group, a cyano group, a nitro group or an acyl group, and preferably an unsubstituted phenylene or naphthylene group or a methyl substituted phenylene or naphthylene group; X represents an organic divalent group combining the nitrogen atom with the carbon atom in the aromatic ring; and n is an integer of 0 to 5, preferably 0 or 1, and more preferably 0.

In the invention, the acryl resin having containing a monomer unit with a phenolic hydroxy group is preferably a homopolymer of the monomer represented by formula (2) or a copolymer of the monomer represented by formula (2) with another monomer. The examples of the homopolymer or copolymer are listed below.

formula (3)

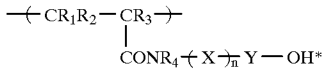

(a)

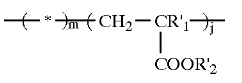

m:j: = 30:70

(b)

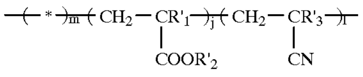

m:j:l = 30:40:30

(c)

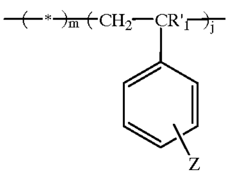

m:j = 50:50

-continued

| | | |
|---|---|---|
| | 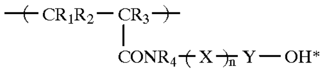 | formula (3) |
| (d) | 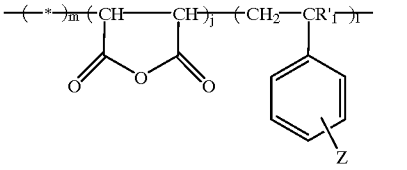 | m:j:l = 40:30:30 |
| (e) | 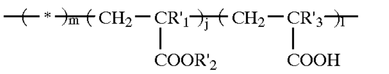 | m:j:l = 30:60:10 |
| (f) | 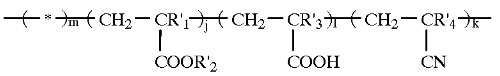 | m:j:l:k = 30:30:10:30 |
| (g) | 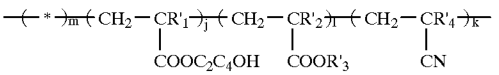 | m:j:l:l = 25:5:40:30 |
| (h) | 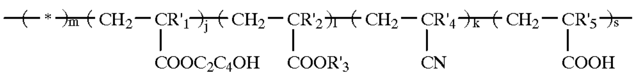 | m:j:l:k:s = 30:5:30:30:5 |
| (i) | 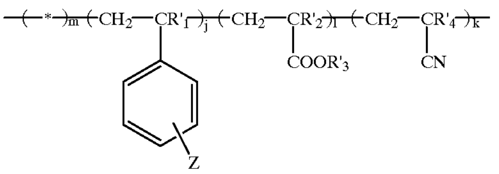 | m:j:l:k = 30:10:40:20 |

In formula (3), $R_1$, $R_2$, $R_3$, $R_4$, X, Y and n are the same as those denoted in formula (2). In the resins (a) through (i), $R_1'$, $R_2'$, $R_3'$, $R_4'$ and $R_5'$ independently represent a hydrogen atom, an alkyl group or a halogen atom; Z represents an alkyl group, acyloxyalkyl group such as acetoxymethyl or 2-acetoxyethyl, or a halogen atom; and m, j, l, k and s independently represent mol %. Z preferably represents acetoxymethyl.

The weight average molecular weight of the acryl resin in the invention is preferably 10,000 to 200,000 measured by gel permeation chromatography (GPC), but is not limited thereto.

Another resin as a binder, such as polyamide, polyether, polyester, polycarbonate, polystyrene, polyurethane, polyvinyl chloride or their copolymers, polyvinylbutyral, polyvinylformal, shellac, an epoxy resin, a phenol resin including a resol or novolak resin or another acryl resin may be optionally used in combination with the acryl resin in the invention.

The content of the acryl resin in the invention in the light sensitive layer is preferably 30 to 90 weight %, and more preferably 40 to 80 weight %.

The infrared absorber used in the light sensitive layer of the image forming material of the invention includes an infrared absorbing dye having an absorption in the wavelength range of 700 nm or more, carbon black and magnetic powder. The especially preferable infrared absorber has an absorption maximum in the wavelength range of 700 nm to 850 nm and having a molar extinction coefficient, $\epsilon$ of $10^5$ or more.

The above infrared absorber includes cyanine dyes, squarium dyes, chloconium dyes, azulenium dyes, phthalocyanine dyes, naphthalocyanine dyes, polymethine dyes, naphthoquinone dyes, thiopyrilium dyes, dithiol metal complex dyes, anthraquinone dyes, indoaniline metal complex dyes and intermolecular charge transfer complex dyes.

The above described infrared absorber includes compounds disclosed in Japanese Patent O.P.I. Publication Nos. 63-139191/1988, 64-33547/1989, 1-160683/1989, 1-280750/1989, 1-293342/1989, 2-2074/1990, 3-26593/1991, 3-30991/1991, 3-34891/1991, 3-36093/1991, 3-36094/1991, 3-36095/1991, 3-42281/1991 and 3-103476/1991.

The examples of the infrared absorber preferably used in the invention are listed below, but are not limited thereto.

IR1
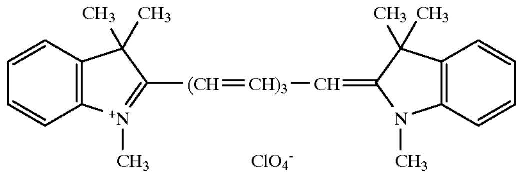
IR2
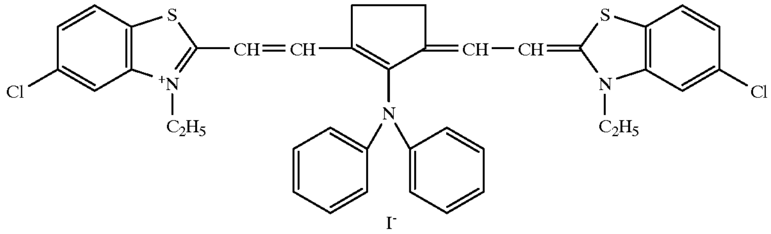
IR3
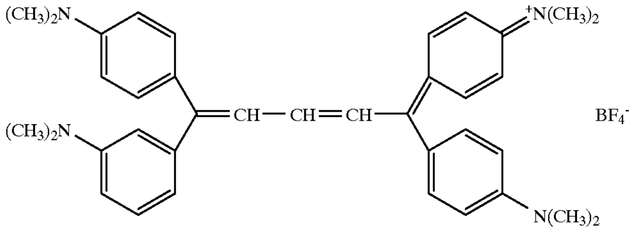
IR4
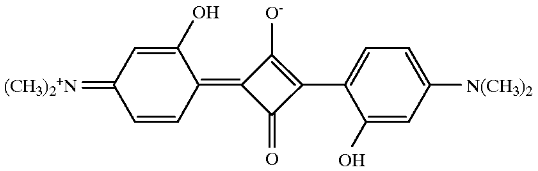
IR5
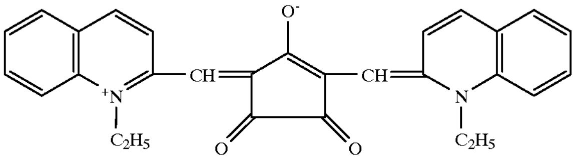
IR6
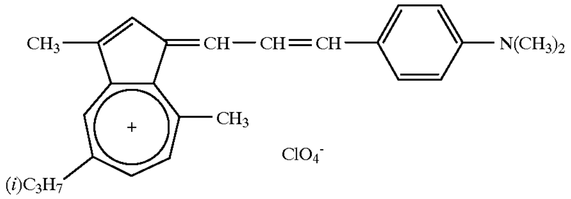

-continued
IR7
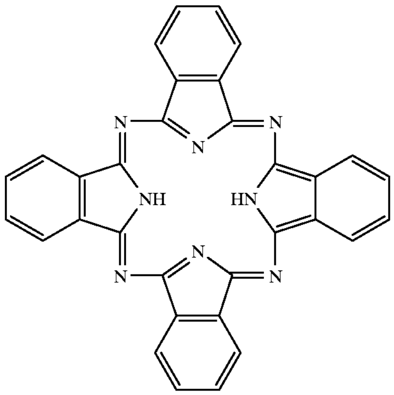
IR8
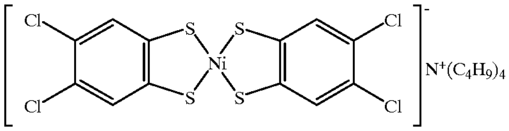
IR9
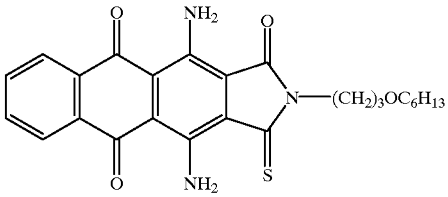
IR10
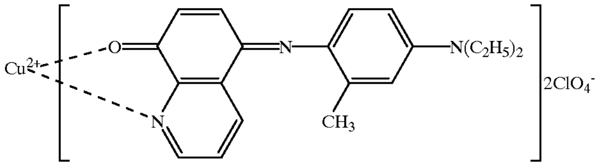
IR11
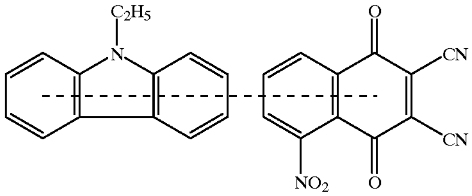
IR12
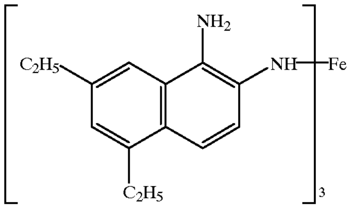

-continued
IR13
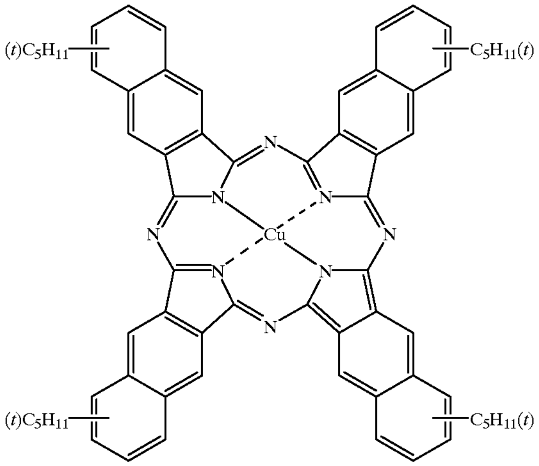
IR14
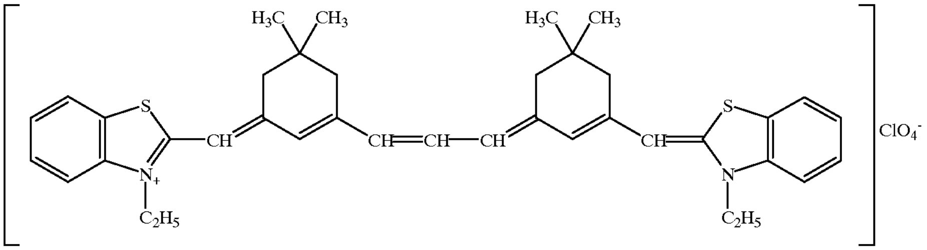
IR15
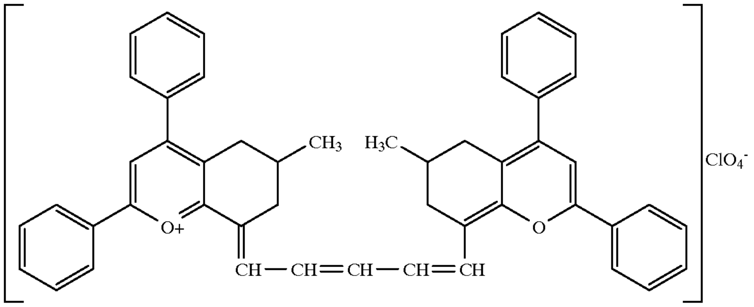
IR16
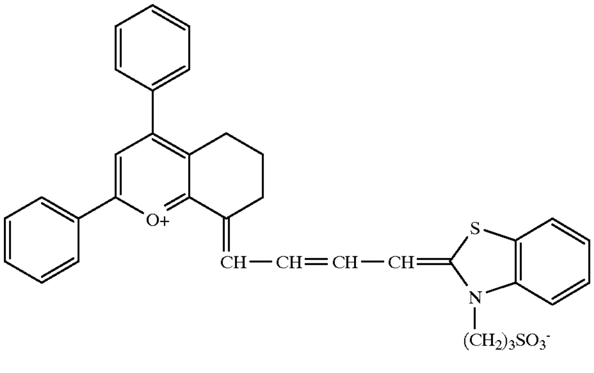

-continued
IR17
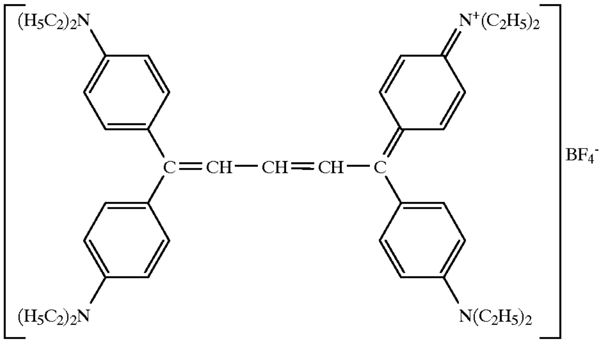
IR18
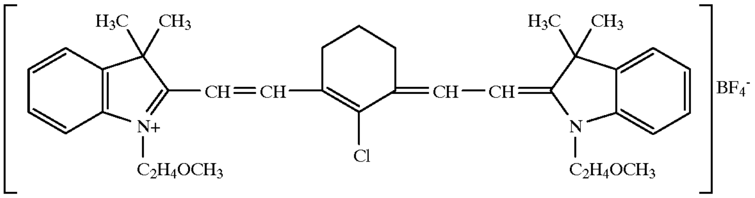
IR19
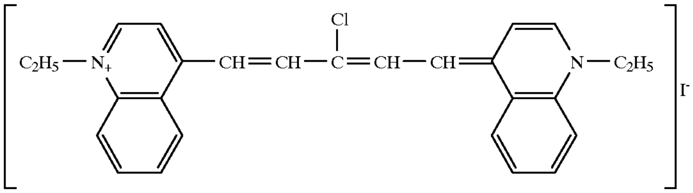
IR20
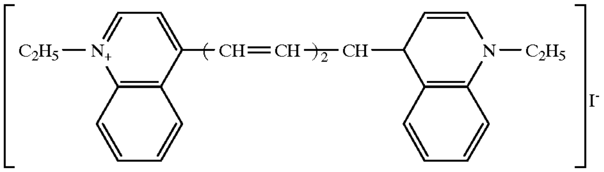
IR21
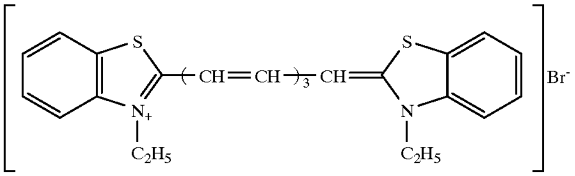
IR22
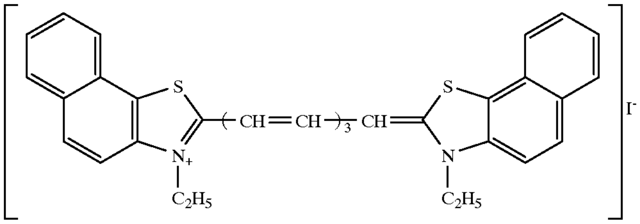
IR23
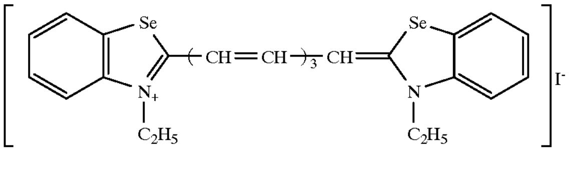

-continued
IR24
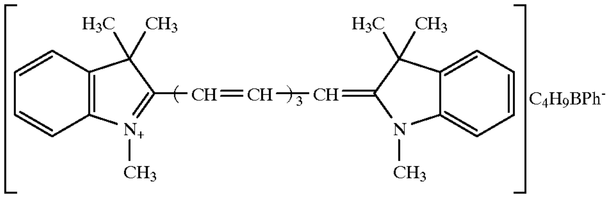
IR25
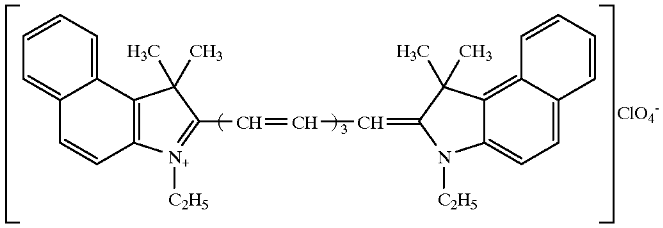
IR26
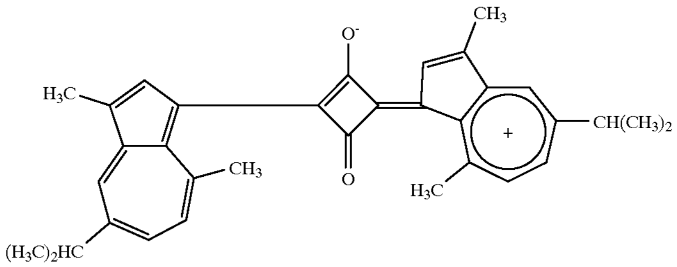
IR27
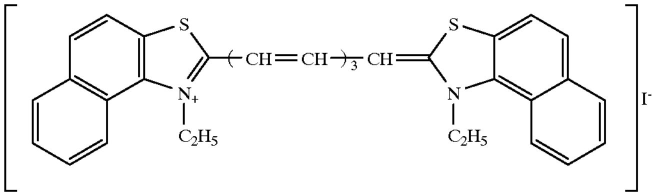
IR28
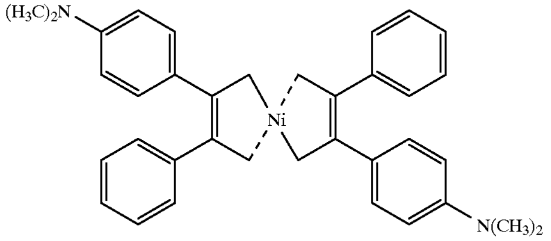
IR29
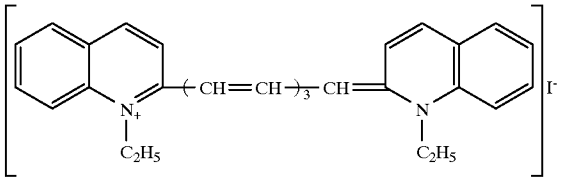
IR30
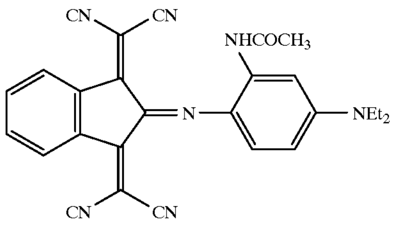

-continued
IR31
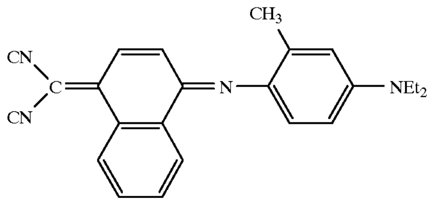
IR32
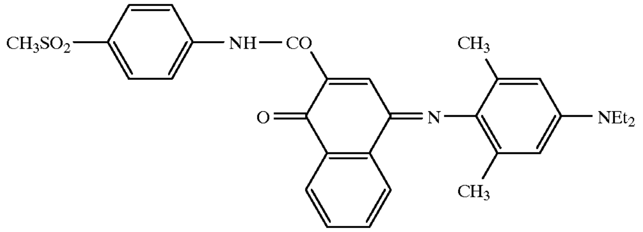
IR33
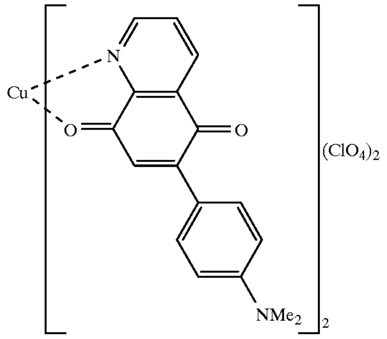
IR34
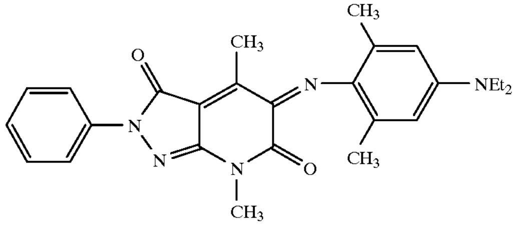
IR35
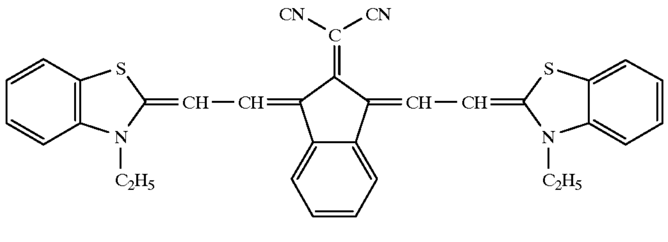
IR36
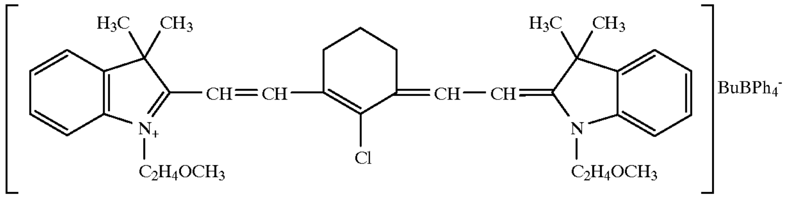

-continued

IR37

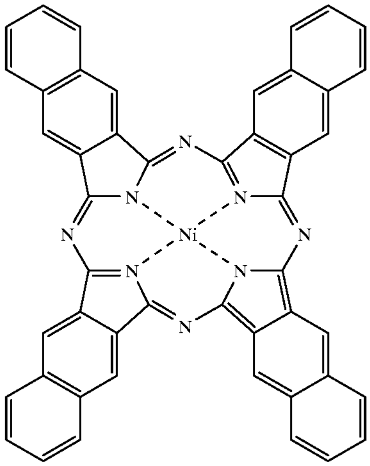

IR38

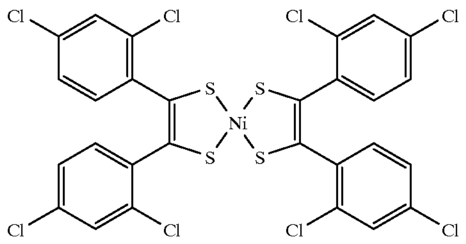

IR39

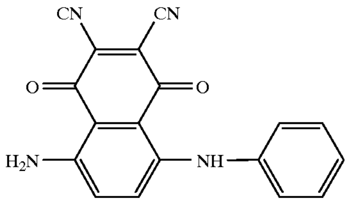

IR40

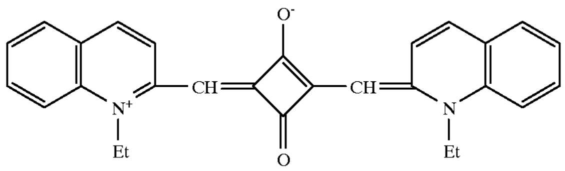

IR41

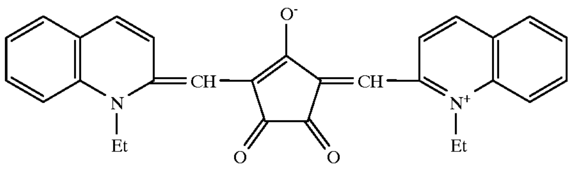

These dyes can be obtained by a conventional synthetic method, and the following commercially available dyes can be used:

IR750 (antraquinone type); IR002 and IR003 (aluminium type), IR820 (polymethine type); IRG022 and IRG033 (diimmonium type); CY-2, CY-4, CY-9 and CY-20, each produced by Nihon Kayaku Co., Ltd;

KIR103 and SIR103 (phthalocyanine type); KIR101 and SIR114 (antraquinone type); PA1001, PA1005, PA1006 and SIR128, (metal complex type), each produced by Mitsui Toatsu Co., Ltd;

Fatogen Blue 8120 produced by Dainihon Ink Kagaku Co., Ltd.; and

MIR-101,1011, and 1021 each produced by Midori Kagaku Co., Ltd.

Other infrared dyes are sold by Nihon Kankoshikiso Co., Ltd., Sumitomo Kagaku Co., Ltd. or Fuji Film Co., Ltd.

In the invention, the content of the infrared absorber is preferably 0.5 to 5% by weight based on the total weight of light sensitive layer.

A binder can be used in the light sensitive layer of the image forming material of the invention. A polymer binder can be used as the binder. The binder includes a novolak resin, a polyhydroxystyrene, a polymer having a structural unit represented by formula (2) and another conventional acryl resin.

The novolak resin includes a phenol-formaldehyde resin, a cresol-formaldehyde resin, a phenol.cresol.formaldehyde resin disclosed in Japanese Patent O.P.I. Publication No. 55-57841/1980 and a polycondensation resin of a p-substituted phenol or phenol and cresol with formaldehyde.

The polyhydroxystyrene includes a homopolymer or copolymer of hydroxystyrene disclosed in Japanese Patent Publication No. 52-41050/1977.

The light sensitive layer in the invention may contain a lipophilic resin to increase lipophilicity of the layer. The lipophilic resin includes a polycondensate of phenols with an alkyl group having 3 to 15 carbon atoms with aldehydes, for example, a t-butylphenol.formaldehyde resin disclosed in Japanese Patent O.P.I. Publication No. 50-125806/1975. The light sensitive layer in the image forming material of the invention may optionally contain dyes other than the dyes described above, pigment or a sensitizer.

The light sensitive layer in the invention is provided on a support by dissolving the components described above in the following solvent, coating the solution on the support and drying, whereby the image forming material of the invention is obtained. The solvent includes propylene glycol monomethylether, propylene glycol monoethylether, methylcellosolve, methylcellosolve acetate, ethylcellosolve, ethylcellosolve acetate, dimethylformamide, dimethylsulfoxide, dioxane, acetone, cyclohexanone, trichloroethylene and methylethyl ketone. These solvents can be used singly or in combination.

The coating method includes conventional coating methods such as a whirler coating method, a wire-bar coating method, a dip coating method, an air-knife coating method, a blade coating method and a curtain coating method. The coating amount of the light sensitive layer in a presensitized planographic printing plate is preferably 0.5 to 5.0 $g/m^2$, although it varies depending on the usage.

The support, on which the light sensitive layer is provides, includes a metal plate such as aluminium, zinc, steel or copper, a metal plate, paper sheet, plastic film or glass plate which is plated or vacuum evaporated with chromium, zinc, copper, nickel, aluminium or iron, a paper sheet coated with a resin, a paper sheet laminated with a metal foil such as aluminium and a plastic film subjected to hydrophilic treatment. Of these, an aluminium plate is preferable. When the invention is applied to a presensitized planographic printing plate, the support is preferably an aluminium plate which is subjected to surface treatments such as graining treatment, anodizing treatment and optionally sealing treatment. The surface treatments are carried out by a conventional method.

The graining treatment includes a mechanically graining method and an electrolytically etching method. The mechanically graining method includes a ball graining method, a brush graining method, a liquid horning graining method and a buff graining method. The above methods can be used singly or in combination according to an aluminium material composition. The electrolytically etching is carried out in a bath containing one or more of phosphoric acid, sulfuric acid, hydrochloric acid and nitric acid. After graining, the surface of the support is optionally subjected to desmut treatment using an alkaline or acid solution to neutralize and washed with water.

The anodizing is carried out by electrolyzing the surface of the aluminium support using the aluminium plate as an anode in a solution containing one or more of sulfuric acid, chromic acid, oxalic acid, phosphoric acid and malonic acid. The thickness of the anodizing film formed is suitably 1 to 50 $mg/dm^2$, preferably 10 to 40 $mg/dm^2$, and more preferably 25 to 40 $mg/dm^2$. The thickness of the anodizing film is obtained by immersing the anodized aluminium in a solution containing phosphoric acid and chromic acid (water is added to 35 ml of 85% phosphoric acid and 20 g of chromium (IV) oxide to make a 1 liter solution) to dissolve the anodized film and measuring the aluminium weight before and after the immersing.

The sealing is carried out by treating the aluminium support with a boiling water, steam, a sodium silicate solution or a dichromic acid solution The image forming material of the invention is imagewise exposed to a light source having a wavelength of 700 nm or more. The light source includes a semiconductor laser, a He-Ne laser, a YAG laser, and a carbon dioxide laser. The output power is suitably 50 mW or more, and preferably 100 mW or more.

The exposed material is heat-treated before developing. The heat-treatment is preferably carried out at 90 to 200° C. for 10 seconds to 3 minutes.

The heat-treated material is developed with an aqueous alkaline developer to remove a light sensitive layer at unexposed portions to form a negative image. The aqueous alkaline developer includes an aqueous solution containing an alkali metal salt such as sodium hydroxide, potassium hydroxide, sodium carbonate, potassium carbonate, sodium metasilicate, potassium metasilicate or di or trisodium phosphate. The metal salt concentration of the developer is preferably 0.05 to 20% by weight, and more preferably 0.1 to 10% by weight. The developer optionally contains an anionic surfactant, an amphoteric surfactant or an organic solvent such as alcohol. The organic solvent includes propylene glycol, ethylene glycol monophenylether, benzyl alcohol and n-propyl alcohol.

EXAMPLES

Next, the present invention will be explained in the examples. In the examples or comparative examples, "parts" represents "parts by weight".

Example 1

Preparation of a support

A 0.24 mm thick aluminium plate (material 1050, quality H16) was degreased at 60° C. for one minute in a 5% sodium hydroxide solution and electrolytically etched at 25° C. for 30 seconds at a current density of 60 $A/dm^2$ in a 0.5 mol/liter hydrochloric acid solution, desmut at 60° C. for 10 seconds in a 5% sodium hydroxide solution, and then anodized at 20° C. for one minute at a current density of 3 $A/dm^2$ in a 20% sulfuric acid solution. The resulting aluminium plate was sealed for 20 seconds with a 30° C. hot water to obtain an aluminium support for a planographic printing plate.

The aluminium plate was coated with the following light sensitive layer coating solution by a whirler, and dried at 100° C. for 2 minutes to obtain a dry thickness of 2 $g/m^2$. Thus, an image forming material sample 1 was prepared.

| Light sensitive layer coating solution | | |
|---|---|---|
| Infrared absorber (Exemplified compound IR18) | 2 | parts |
| Photolytic acid generating compound (Exemplified compound (1)) | 3 | parts |
| Acryl resin A (described below) | 45 | parts |
| Resol resin | 45 | parts |
| Propylene glycol monomethylether | 1000 | parts |

Synthesis of Acryl resin A (Acryl resin in the invention)

In a 500 ml four-neck flask equipped with a thermometer, a reflux condenser, a stirrer, a heater and a nitrogen gas incorporation tube, 9.0 g (0.09 mol) of ethylacrylate, 34.2 g (0.30 mol) of ethylmethacrylate, 15.9 g (0.30 mol) of acrylonitrile, 35.2 g (0.2 mol) p-vinylbenzylacelate, and 51.6 g (0.30 mol) of 4-hydroxyphenyl-methacrylamide were dissolved in a mixture solvent of 125 ml acetone and 125 ml methanol. The resulting solution was added with 3.28 g (0.02 mol) of azobisisobutyronitrile as a polymerization initiator, and heated while stirring under nitrogen gas atmosphere, and refluxed at 60° C. for 6 hours. The resulting solution was cooled and poured into water to obtain resin precipitates. The resulting mixture was filtered out, and the resin was vacuum dried at 50° C. for 24 hours. The yield was 100 g (90%). The average weight molecular weight of the resin was 50,000 in terms of pullulan according to a gel permeation chromatography (GPC) method. The solvent used for GPC was N,N-dimethylformamide (DMF).

The two resulting image forming materials were image-wise exposed to a semiconductor laser (having a wavelength of 830 nm and an output of 500 mW). The laser light spot diameter was 13 $\mu$m at $1/e^2$ of the peak intensity. The resolving degree was 2,000 DPI in both the main and the sub scanning directions. One of the exposed materials was heated at 120° C. for 3 minutes and the other at 120° C. for 30 seconds, using an infrared radiation heater. The heated materials were developed at 27° C. in 25 seconds with developer in which a positive working PS plate developer, SDR-1 (produced by Konica Corporation) was diluted 7 times by volume with water to remove non-image portions (exposed portions) and washed with water. Thus, two planographic printing plates were obtained.

The image forming materials were evaluated for sensitivity and printing durability as follows:

Sensitivity was represented in terms of exposure energy ($mJ/cm^2$) necessary to form an image when the material was exposed and heated and then developed under the above conditions. In the above processing, sensitivity obtained when heated at 120° C. for 3 minutes was designated as Sensitivity 1, and sensitivity obtained when heated at 120° C. for 30 seconds was designated as Sensitivity 2. Sensitivities 1 and 2 are shown in Table 1.

Printing was carried out employing a printing machine Mitsubishi DAIYA (produced by Mitsubishi Jukogyo Co., Ltd.), ink High Echo (produced by Toyo Ink Seizo Co., Ltd), and the planographic printing plate obtained when heated at 120° C. for 3 minutes, until stain occurrence at non-image portions was observed, and the number of prints at which the stain occurred was determined for evaluation of printing durability.

Comparative Example 1

The image forming material sample (Comparative sample 1) was prepared in the same manner as in Example 1, except that a novolak resin, which was a copolycondensate of phenol, m-cresol and p-cresol with formaldehyde (Mn=500, Mw=2,500, phenol:m-cresol:p-cresol=20:48:32 by mol ratio), was used instead of Acryl resin A in the light sensitive layer coating solution. The resulting sample was processed and evaluated in the same manner as in Example 1.

Example 2

The image forming material sample 2 was prepared in the same manner as in Example 1, except that the following Acryl resin B was used instead of Acryl resin A in the light sensitive layer coating solution.

Acryl resin B (Acryl resin in the invention)

Synthesis of Acryl resin B

Acryl resin B was prepared in the same manner as in Synthesis of Acryl resin A above, except that p-vinylbenzyl acetate was not used.

The resulting sample was processed and evaluated in the same manner as in Example 1.

Example 3

The image forming material sample 3 was prepared in the same manner as in Example 1, except that the following Acryl resin C was used instead of Acryl resin A in the light sensitive layer coating solution.

Acryl resin C (Acryl resin in the invention)

Synthesis of Acryl resin C

Acryl resin C was prepared in the same manner as in Synthesis of Acryl resin A above, except that N,N-dimethylol methacrylamide was used instead of p-vinylbenzyl acetate.

The resulting sample was processed and evaluated in the same manner as in Example 1.

Example 4

The image forming material sample 4 was prepared in the same manner as in Example 1, except that p-hydroxystyrene-methylmethacrylate (1:1 by mole ratio) copolymer (Acryl resin D) was used instead of Acryl resin A in the light sensitive layer coating solution. The resulting sample was processed and evaluated in the same manner as in Example 1.

Comparative Example 2

The image forming material sample (Comparative sample 2) was prepared in the same manner as in Example 1, except that the following Acryl resin E was used instead of Acryl resin A in the light sensitive layer coating solution.

Acryl resin E (outside the acryl resin in the invention)

Synthesis of Acryl resin E

Acryl resin E was prepared in the same manner as in Synthesis of Acryl resin A above, except that 4-hydroxyphenyl methacrylamide was not used.

The resulting sample was processed and evaluated in the same manner as in Example 1.

Comparative Example 3

The image forming material sample (Comparative sample 3) was prepared in the same manner as in Example 1, except that the following Acryl resin F was used instead of Acryl resin A in the light sensitive layer coating solution.

Acryl resin F (outside the acryl resin in the invention)

Synthesis of Acryl resin F

Acryl resin F was prepared in the same manner as in Synthesis of Acryl resin B above, except that 4-hydroxyphenyl methacrylamide was not used.

The resulting sample was processed and evaluated in the same manner as in Example 1.

The results are collectively shown in Table 1.

TABLE 1

| | Sensitivity 1 (mj/cm$^2$) | Sensitivity 2 (mj/cm$^2$) | Printing Number |
|---|---|---|---|
| Sample 1 | 150 | 300 | 150,000 |
| Comparative Sample 1 | 200 | 400 | 50,000 |
| Sample 2 | 200 | 350 | 150,000 |
| Sample 3 | 150 | 300 | 150,000 |
| Sample 4 | 200 | 350 | 100,000 |
| Comparative Sample 2 | 400 | — | 80,000 |
| Comparative Sample 3 | 500 | — | 100,000 |

—: An image was not formed. (The light sensitive layer at image and non-image portions was removed.)

As is apparent from Table 1, the image forming material samples of the invention provide high sensitivity and high printing durability as compared with the comparative samples.

What is claimed is:

1. An image forming material comprising a support and provided thereon, a light sensitive layer containing a compound capable of generating an acid on exposure of an active light, a resol resin, an acryl resin containing a monomer unit with a phenolic hydroxy group, and an infrared absorber, wherein said monomer is selected from the group consisting of N-4-hydroxyphenylacrylamide, N-4-hydroxyphenylmethacrylamide, o-hydroxystyrene, p-hydroxystyrene, m-hydroxystyrene, o-hydroxyphenylacrylate, p-hydroxyphenylacrylate, m-hydroxyphenylacrylate, p-(hydroxyphenyl)sulfonylacrylamide, and p-(hydroxyphenyl)sulfonylmethacrylamide.

2. The material of claim 1, wherein the light sensitive layer contains said compound in an amount of 0.1 to 20 weight %, said resol resin in an amount of 5 to 80 weight %; said acryl resin in an amount of 30 to 90 weight %, and said infrared absorber in an amount of 0.5 to 5 weight %.

3. The material of claim 1, wherein said compound is halogenated alkyl-containing triazines or halogenated alkyl-containing oxadiazoles.

4. The material of claim 3, wherein said compound is halogenated alkyl-containing s-triazines.

5. The material of claim 1, wherein said monomer is N-4-hydroxyphenylacrylamide, N-4-hydroxyphenylmethacrylamide, p-(hydroxyphenyl)sulfonylacrylamide, or p-(hydroxyphenyl)-sulfonylmethacrylamide.

6. The material of claim 1, wherein said infrared absorber has an absorption maximum in the wavelength range of 700 nm to 850 nm and has a molar extinction coefficient, $\epsilon$ of $10^5$ or more.

7. The material of claim 1, wherein said support is an aluminum plate.

8. The material of claim 1, wherein the coating amount of the light sensitive layer is 0.5 to 5.0 g/m$^2$.

9. An image forming method comprising the steps of: imagewise exposing an image forming material to infrared rays, said material comprising a support and provided thereon, a light sensitive layer containing a compound capable of generating an acid on exposure of infrared rays, a resol resin, an acryl resin containing a monomer unit with a phenolic hydroxy group, and an infrared absorber, wherein said monomer is selected from the group consisting of N-4-hydroxyphenylacrylamide, N-4-hydroxyphenylmethacrylamide, o-hydroxystyrene, p-hydroxystyrene, m-hydroxystyrene, o-hydroxyphenylacrylate, p-hydroxyphenylacrylate, m-hydroxyphenylacrylate, p-(hydroxyphenyl)sulfonylacrylamide, and p-(hydroxyphenyl)sulfonylmethacrylamide;

heat-treating the exposed material; and removing a light sensitive layer at unexposed portions of the heat-treated material with an alkaline developer to form a negative image.

10. The method of claim 9, wherein said heat-treating is preferably carried out at 90 to 200° C. for 10 seconds 3 to minutes.

11. The material of claim 5, wherein said monomer is N-4-hydroxyphenylacrylamide or N-4-hydroxyphenylmethacrylamide.

12. The material of claim 1, wherein said acryl resin further contains a monomer unit selected from vinylbenzyl acetate or vinylphenethyl acetate.

* * * * *